US008072238B1

(12) United States Patent
Hutton

(10) Patent No.: US 8,072,238 B1
(45) Date of Patent: *Dec. 6, 2011

(54) PROGRAMMABLE LOGIC DEVICE ARCHITECTURE WITH THE ABILITY TO COMBINE ADJACENT LOGIC ELEMENTS FOR THE PURPOSE OF PERFORMING HIGH ORDER LOGIC FUNCTIONS

(75) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/883,297

(22) Filed: Sep. 16, 2010

Related U.S. Application Data

(63) Continuation of application No. 11/430,370, filed on May 8, 2006, now Pat. No. 7,812,635.

(51) Int. Cl.
*H03K 19/177* (2006.01)
*H03K 17/62* (2006.01)

(52) U.S. Cl. .............................. 326/39; 326/38; 326/47

(58) Field of Classification Search .............. 326/37–41, 326/47
See application file for complete search history.

(56) References Cited

U.S. PATENT DOCUMENTS

| | | | | |
|---|---|---|---|---|
| 6,150,838 A * | 11/2000 | Wittig et al. | .................. | 326/39 |
| 6,480,023 B1 * | 11/2002 | Kaviani | ................. | 326/38 |
| 6,480,025 B1 * | 11/2002 | Altaf | ................. | 326/39 |
| 6,556,042 B1 * | 4/2003 | Kaviani | ................. | 326/39 |
| 6,798,240 B1 * | 9/2004 | Pedersen | .................. | 326/39 |
| 6,847,229 B2 * | 1/2005 | New et al. | .................. | 326/39 |
| 7,010,777 B1 | 3/2006 | Hutton | | |
| 7,030,650 B1 * | 4/2006 | Kaptanoglu et al. | ............. | 326/40 |
| 7,042,248 B1 * | 5/2006 | Hutton et al. | ................... | 326/41 |
| 7,167,021 B1 * | 1/2007 | Lewis | ................. | 326/37 |
| 7,317,330 B2 * | 1/2008 | Pedersen | .................. | 326/39 |
| 7,330,052 B2 | 2/2008 | Kaptanoglu et al. | | |
| 7,358,761 B1 * | 4/2008 | Sunkavalli et al. | ............. | 326/38 |
| 7,671,625 B1 | 3/2010 | Schleicher et al. | | |
| 7,852,114 B2 * | 12/2010 | Bertin et al. | .................. | 326/38 |

OTHER PUBLICATIONS

Baeckler et al., U.S. Appl. No. 10/622,923 entitled Techniques for mapping to a Shared Lookup Table Mask filed Jul. 17, 2003.
"Cyclone II Device Handbook, vol. 1, Chapter 1, Introduction", Altera Corporation, Jun. 2006.

(Continued)

*Primary Examiner* — Rexford N Barnie
*Assistant Examiner* — Crystal L Hammond
(74) *Attorney, Agent, or Firm* — Weaver Austin Villeneuve & Sampson, LLP

(57) ABSTRACT

A high efficiency PLD architecture having logic elements that can be selectively combined to perform higher order logic functions than can be performed alone by a single logic element. The programmable logic device includes a logic block having a first logic element. The first logic element includes a first pair of sub-function generators and is capable of implementing logic functions of a first order. The logic block also includes a second logic element having a second pair of sub-function generators. A programmable sharing circuitry is also included in the logic block. The programmable sharing circuitry selectively couples the first pair of sub-function generators and the second pair of sub-function generators so that the first logic element is capable of performing logic functions of either (i) the first order, or (ii) a second order. The second order is higher than the first order.

23 Claims, 13 Drawing Sheets

OTHER PUBLICATIONS

"Cyclone II Device Handbook, vol. 1, Chapter 2, Cyclone II Architecture", Altera Corporation, Jun. 2006.
"Stratix II Device Handbook, vol. 1, Chapter 1, Introduction", Altera Corporation, Apr. 2006.
"Stratix II Device Handbook, vol. 1, Chapter 2, Stratix II Architecture", Altera Corporation, Aug. 2006.
"The Virtex Family Overview by Xilinx Corporation", Mar. 26, 2005.
"Stratix I Device Handbook, vol. 1, Chapter 1, Stratix II Architecture", Altera Corporation, Jul. 2005.
"Stratix II Device Handbook, vol. 1, Chapter 2, Stratix II Architecture", Altera Corporation, Jul. 2006.

* cited by examiner

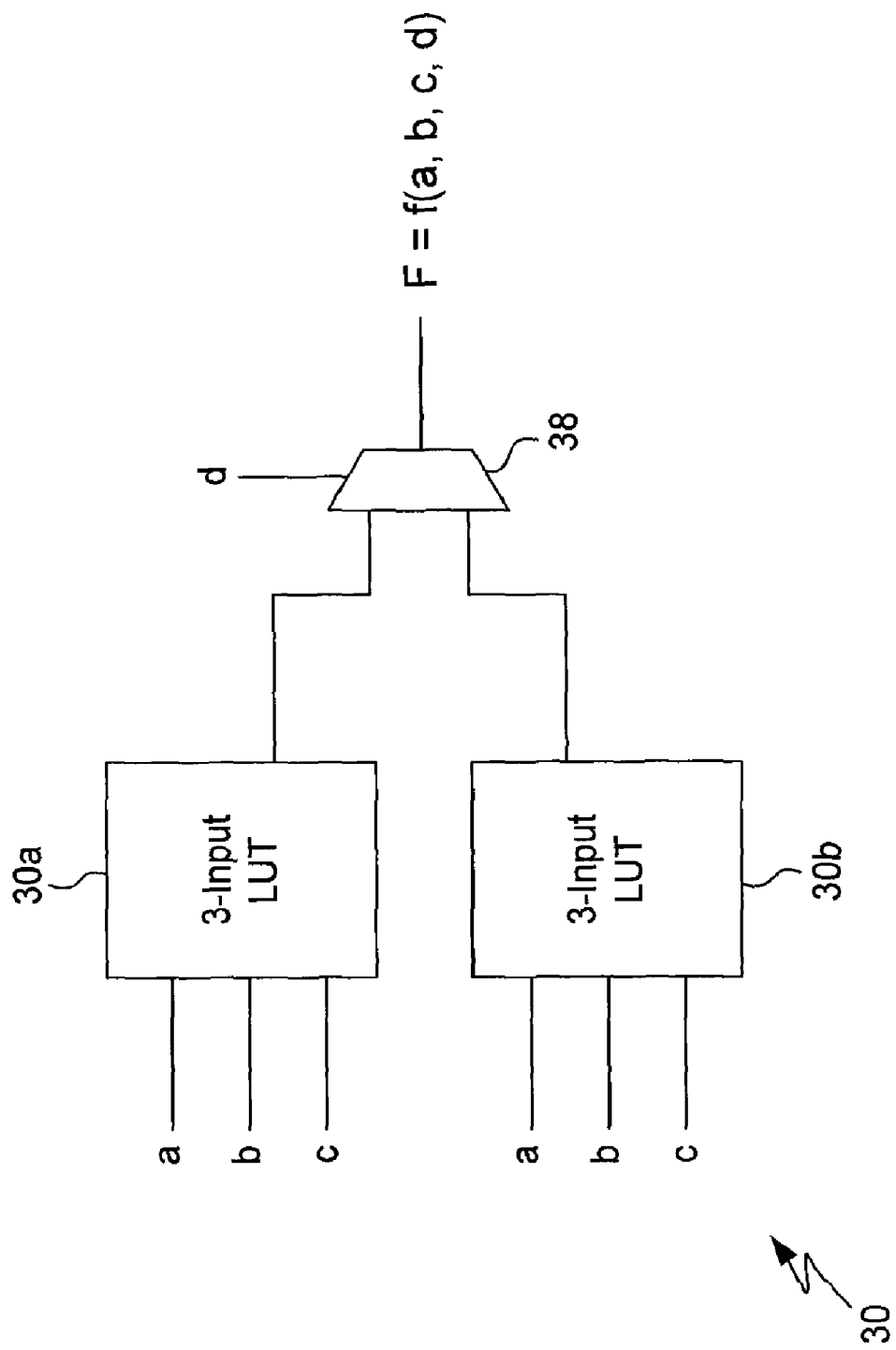

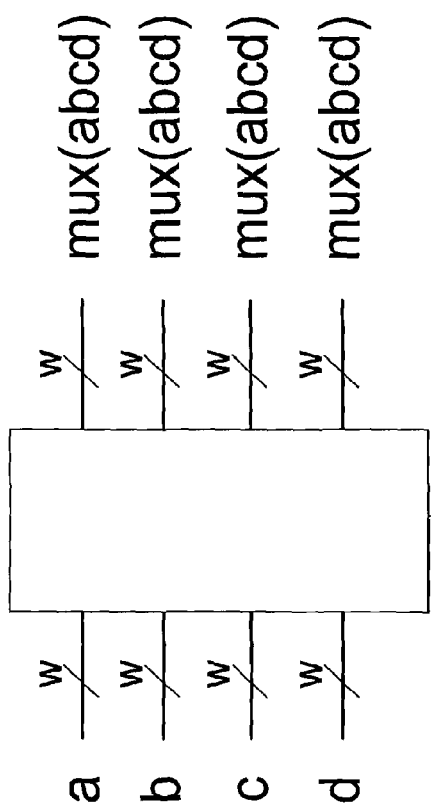
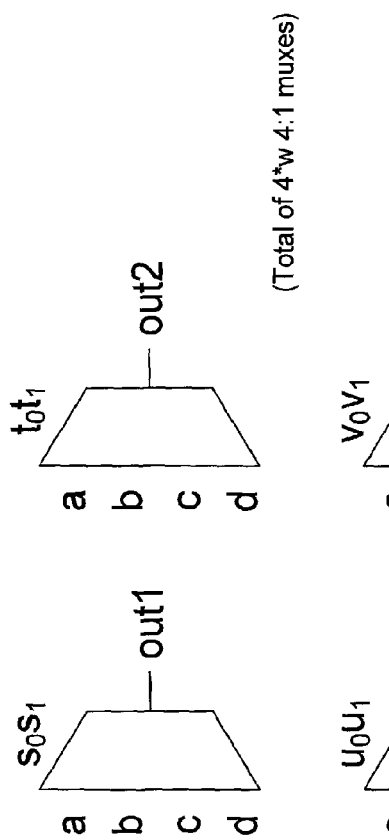
FIG. 9B

US 8,072,238 B1

PROGRAMMABLE LOGIC DEVICE ARCHITECTURE WITH THE ABILITY TO COMBINE ADJACENT LOGIC ELEMENTS FOR THE PURPOSE OF PERFORMING HIGH ORDER LOGIC FUNCTIONS

CROSS-REFERENCE TO RELATED APPLICATIONS

This application claims priority under 35 U.S.C. §120 and is a continuation of U.S. patent application Ser. No. 11/430,370, filed May 8, 2006, titled "PROGRAMMABLE LOGIC DEVICE ARCHITECTURE WITH THE ABILITY TO COMBINE ADJACENT LOGIC ELEMENTS FOR THE PURPOSE OF PERFORMING HIGH ORDER LOGIC FUNCTIONS", which is hereby incorporated by reference in its entirety.

BACKGROUND

1. Field of the Invention

The present invention generally relates to programmable logic devices, and more particularly, to a programmable logic device having adjacent logic elements that can be selectively combined to perform higher order logic functions that can not be performed alone by a single logic element.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), programmable registers, adders and other circuitry to implement various logic and arithmetic functions.

Almost all current PLDs are based on a four (4) input LUT architecture. A four input LUT enables the implementation of a four-variable logic function. Logic functions implemented in PLDs are, however, very often of greater complexity and define more than four variables. In such situations, more than one LUT is needed to implement the function. With a function with six variables for example, anywhere from two to five LUTs may be required. The more LUTs required to implement a given logic function, the fewer LUTs are available for performing other logic. Current PLD architectures are therefore relatively inefficient when implementing complex logic functions.

A higher efficiency PLD architecture having adjacent logic elements that can be selectively combined to perform higher order logic functions that can not be performed alone by a single logic element is therefore needed.

SUMMARY OF THE INVENTION

A high efficiency PLD architecture having adjacent logic elements that can be selectively combined to perform higher order logic functions that can not be performed alone by a single logic element is described. The programmable logic device includes a logic block having a first logic element including a first look up table. The first look up table includes a first pair of sub-function generators and is capable of implementing logic functions of a first order. The logic block also includes a second logic element having a second input look up table including a second pair of sub-function generators. Programmable sharing circuitry is also included in the logic block. The programmable sharing circuitry selectively couples the first pair of sub-function generators and the second pair of sub-function generators so that the first logic element is capable of performing logic functions of either (i) the first order, or (ii) a second order, wherein the second order is higher than the first order.

BRIEF DESCRIPTION OF THE DRAWINGS

The invention may best be understood by reference to the following description taken in conjunction with the accompanying drawings, which illustrate specific embodiments of the present invention.

FIGS. 4A and 4B are block diagram of a typical four input LUT used in PLDs.

FIGS. 9A and 9B show barrel-shifter and a cross-bar functions implemented using the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
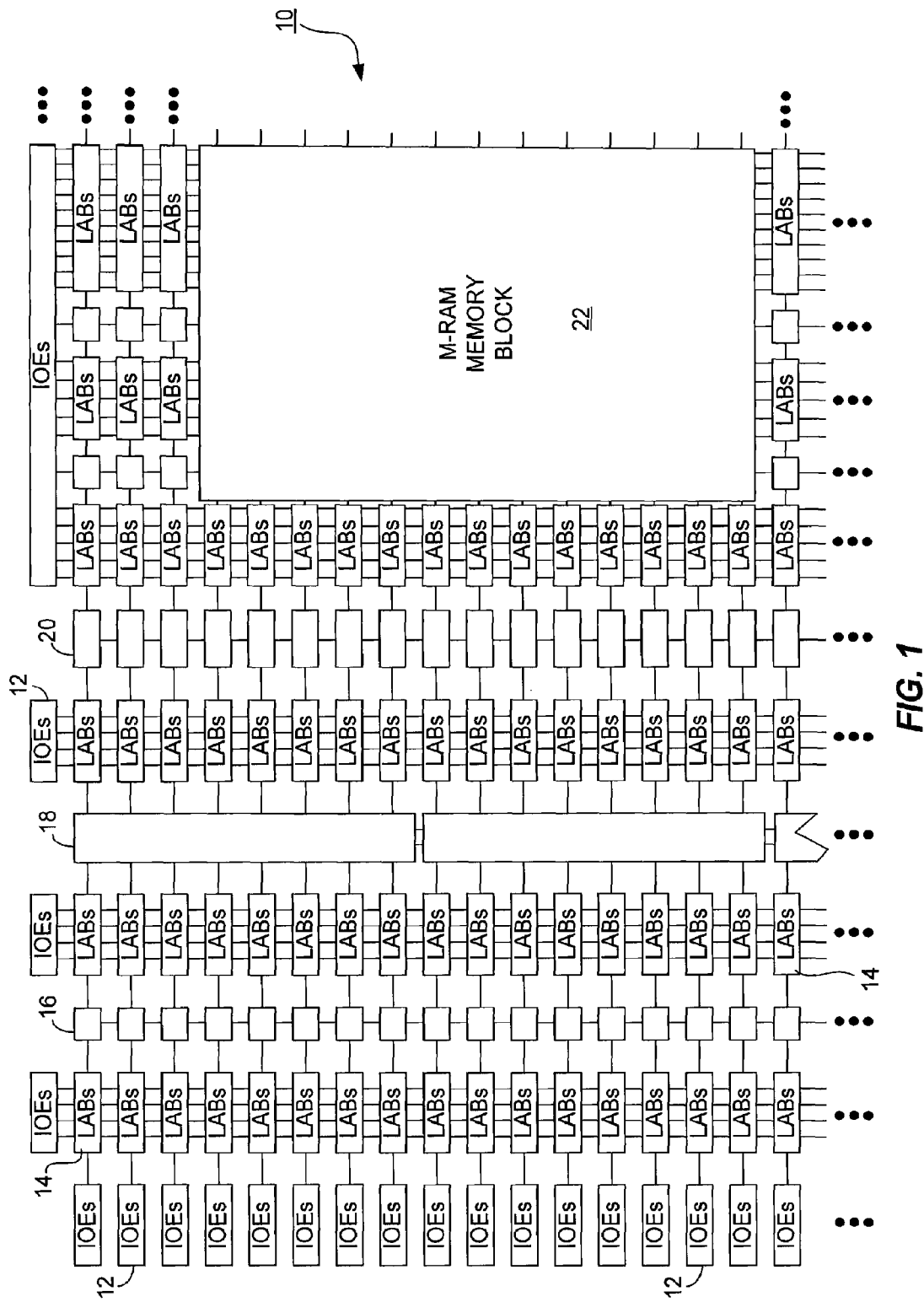
FIG. 1 is a block diagram of a Programmable Logic Device (PLD) of the present invention.

Referring to FIG. 1, a block diagram of an exemplary Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22 each provided at different locations across the device.

In one embodiment, the LABs 14 include a number of logic elements (LEs) (not visible in the figure) which are the basic logic building blocks for implementing user defined logic functions. The RAM blocks 16 are memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits.

It should be noted that the PLD 10 is merely exemplary and in no way should be construed as limiting the invention. For more information on the specific PLD architecture 10 illustrated in FIG. 1, see for example the Stratix II Architecture, Functional Description, pages 2-1 through 2-104, from the Altera Corporation "Stratix II Device Handbook", Volume 1, May, 2005, or the Stratix Architecture, Version 3.3, July, 2005, both incorporated by reference herein for all purposes. The present invention, however, as described in detail below can be implemented in any type of programmable logic device that relies on or uses look up tables (LUTs) for implementing logic functions.

Figure 2:
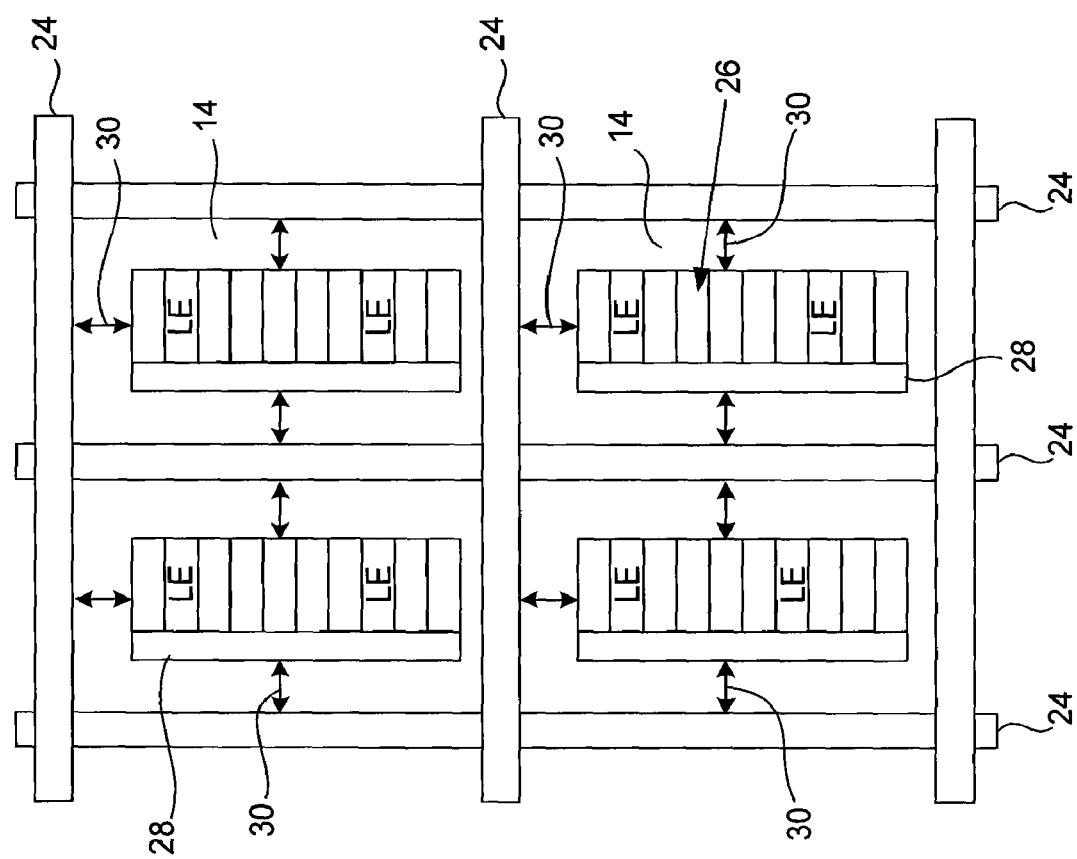
FIG. 2 is a block diagram of several logic array blocks (LABs) in the PLD of the present invention.

Referring to FIG. 2, a block diagram of several logic array blocks (LABs) in an exemplary PLD is shown. The figure shows four LABs 14 interconnected by a plurality of horizontal (row) and vertical (column) interconnect lines 24. Each LAB 14 includes a plurality of logic elements (LEs) 26. In the embodiment shown, there are ten (10) LEs 26 per LAB 14. It should be noted that this number is arbitrary, and that any number of LEs 26 may be used per LAB 14. A local interconnect 28 is also provided to interconnect the LEs 26 within each LAB 14. Interconnects 30 are provided between the LEs 26 of each LAB 14 and the horizontal and vertical interconnects 24.

Figure 3:
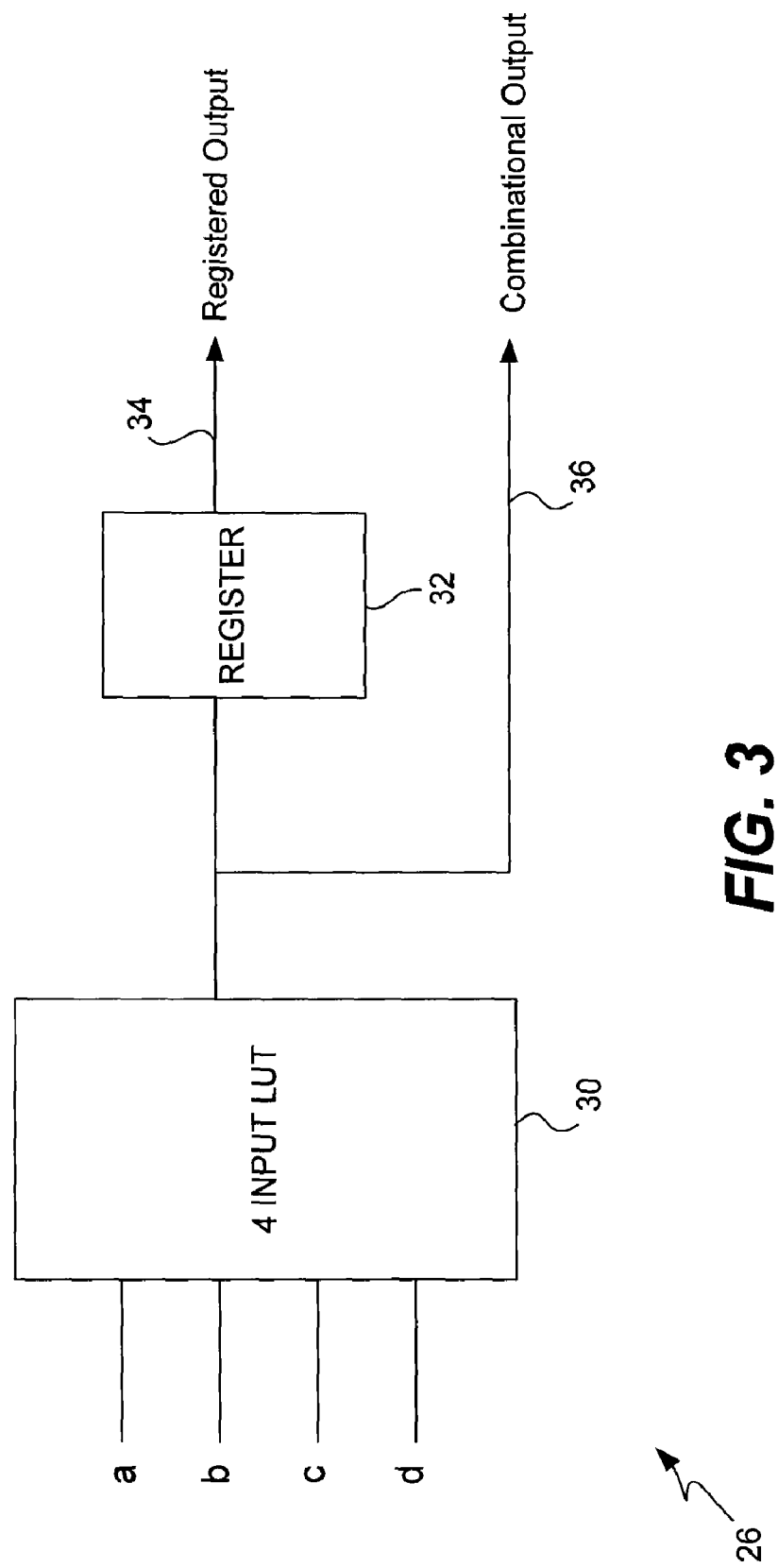
FIG. 3 is a block diagram of a Logic Element (LE) used in the LAB of the present invention.

Referring to FIG. 3, a logic block diagram of a Logic Element (LE) used in the LAB of the present invention is shown. The LE 26 includes a four (4) input LUT 30 and a register 32. The LUT 30 is coupled to receive four select input signals (a, b, c, and d). The output of the LUT 30 is provided as either a registered output 34 through register 32 or as a combinational output signal 36. In either case, the output of the LUT 30 is an arbitrary four input function of F=$f$(a, b, c, d).

Figure 4A:
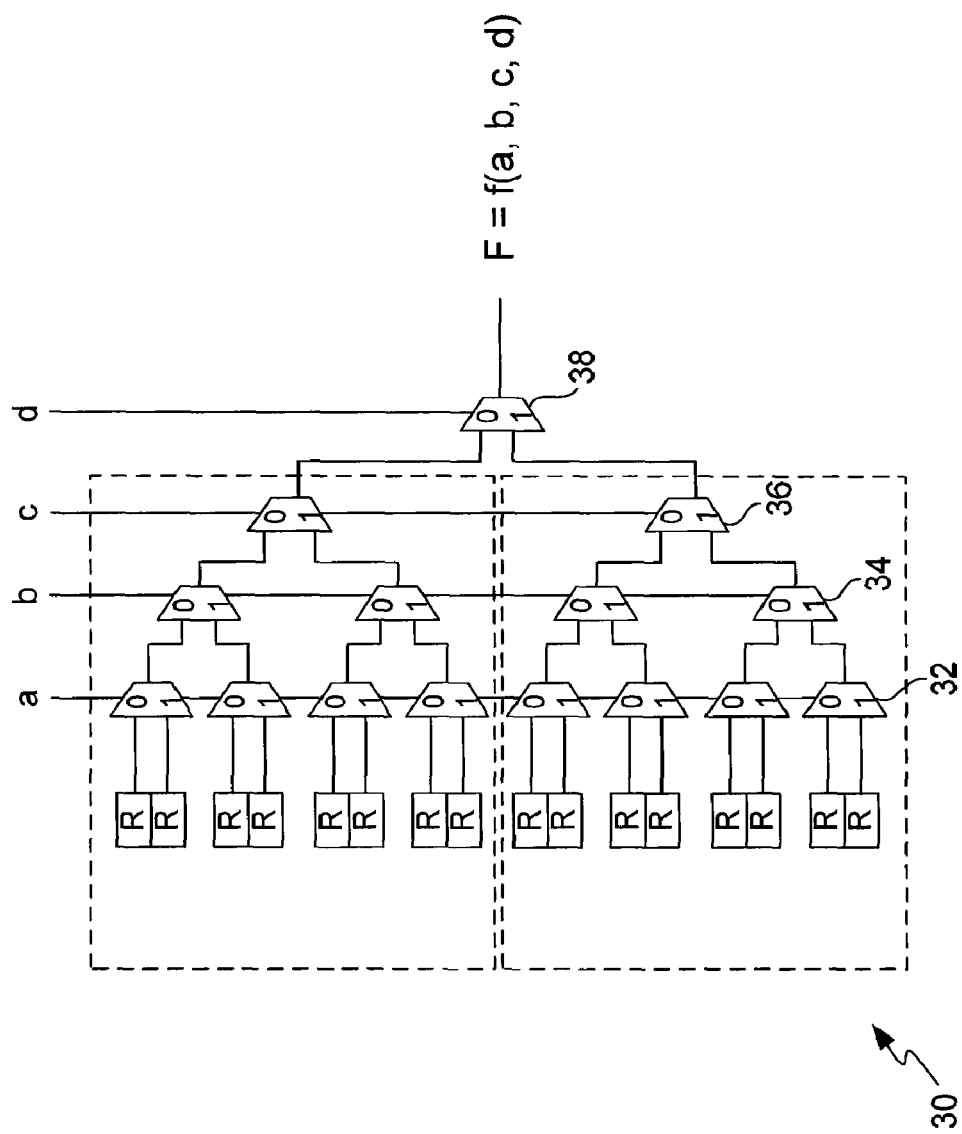

FIGS. 4A and 4B is a circuit block diagrams of the four input LUT 30. As illustrated in FIG. 4A, the LUT includes sixteen configuration RAM bits, each designated by the letter "R". The contents of each of the configuration RAM bits R are fed into a first level of muxes 32. The output of the first level of muxes 32 are fed into a second level of muxes 34. The output of the second level of muxes 34 are fed into a third level of muxes 36. The first, second and third level of muxes 32, 34 and 36 are driven by select lines "a", "b", and "c" respectively. A fourth level of mux 38, which is driven by select input "d", is used to generate the arbitrary four input function of F=$f$(a, b, c, d). Thus, depending on the state of the four select signals a, b, c and d, the contents of one of the configuration ram bits R is selected.

Using the well known Shannon decomposition, any four-input function F=$f$(a,b,c,d) can be expressed as F=d* $f$1(a,b,c)+d' $f$2(a,b,c). In other words, a four input LUT function is actually constructed out of two sub-function three (3) input LUTs acting on the select inputs (a,b,c) and a two-to-one (2:1) mux 38 controlled by the fourth select input "d".

FIG. 4B illustrates a logic element 30 having two three (3) input sub-function generators 30$a$ and 30$b$, each receiving select input signals (a,b,c). The outputs of two LUTS 30$a$ and 30$b$ are provided to the mux 38 which is driven by select input "d". Generalizing, the function of a LUT 30, the output of a k-input LUT typically consists of two k−1 LUTs and a two-to-one (2:1) mux controlled by the k$^{th}$ input.

Figure 5:
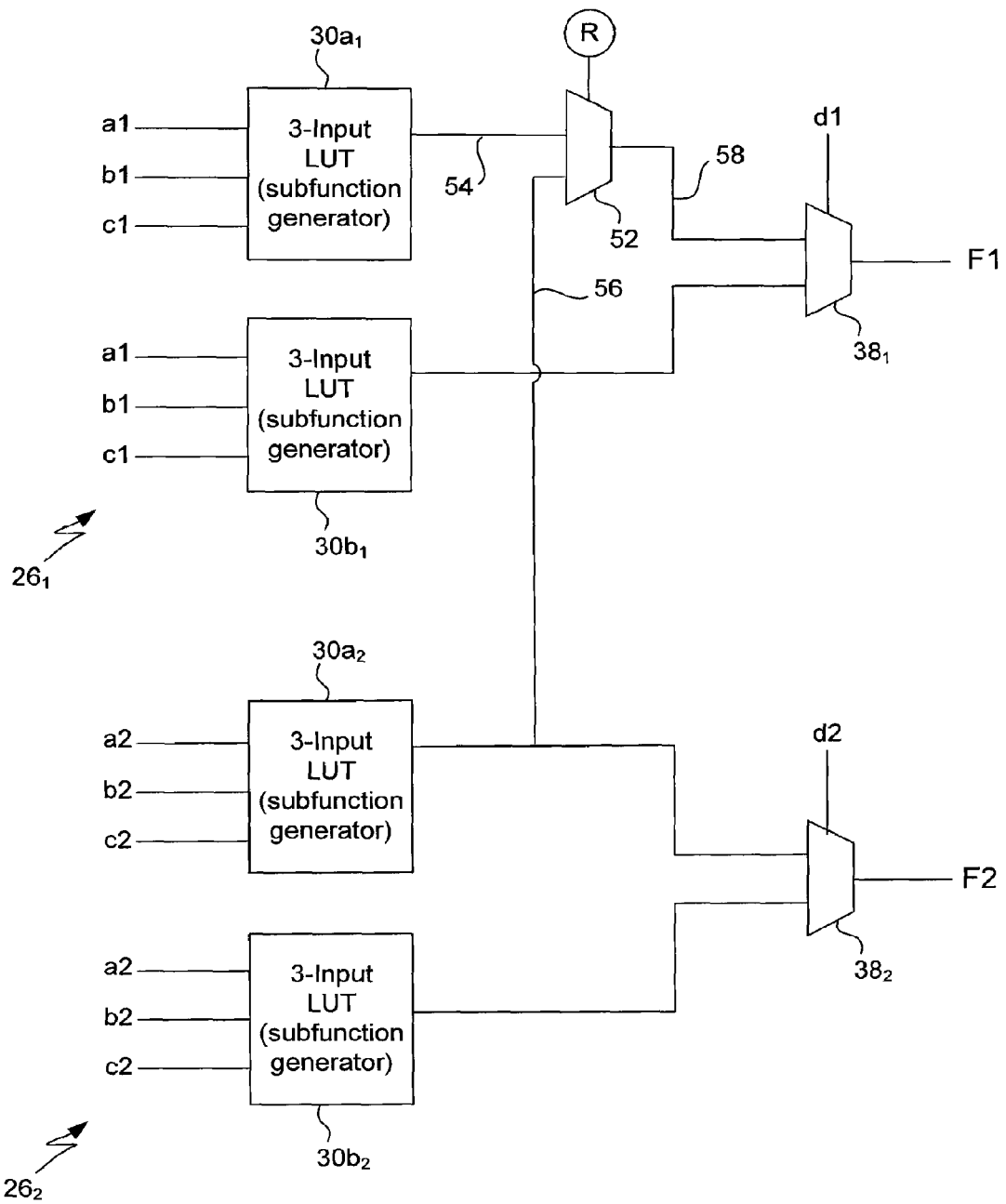
FIG. 5 is a logic diagram illustrating the combination of adjacent LUTs to implement high order logic functions according to one embodiment of the present invention.

Referring to FIG. 5, a logic diagram illustrating the combination of adjacent LEs to implement high order logic functions according to one embodiment of the present invention is shown. In this embodiment, the first LE $26_1$ includes two 3 input LUTs $30a_1$ and $30b_1$ (i.e., sub-function generators) and an output mux $38_1$. The two LUTs $30a_1$ and $30b_1$ are each configured to receive select signals (a1, b1 and c1). The output mux $38_1$ is configured to receive select signal d1. The second LE $26_2$ includes two 3 input LUTs $30a_2$ and $30b_2$ (i.e., sub-function generators) and an output mux $38_2$. The two LUTs $30a_2$ and $30b_2$ are each configured to receive select signals (a2, b2 and c2). The output mux $38_2$ is configured to receive select signal d2.

To selectively combine the two adjacent LEs $26_1$ and $26_2$ so that higher order logic functions can be performed, a mux 52 is provided between LUT $30a_1$ and mux $38_1$ of the LE $26_1$. The mux 52 is configured to receive a first input 54 from the output of LUT $30a_1$ of LE $26_1$ and a second input 56 from the LUT $30a_2$ from LE $26_2$. The output 58 of the mux 52 is connected to one of the inputs of the mux $38_1$. A configuration bit R is used to control the mux 52.

When R is configured to select input 54 (i.e., reset), the invention is disabled and the LEs $26_1$ and $26_2$ will each operate in the identical manner as the LEs described above in relation to FIGS. 4A and 4B. In other words, each LE $26_1$ and $26_2$ is capable of generating an arbitrary four input function F1=$f_1$ ($a_1$, $b_1$, $c_1$, $d_1$).

On the other hand, when the configuration bit R is set, the LE $26_1$ is capable of performing an "incomplete" seven (7) input LUT function. Specifically, the LE $26_1$ is capable of implementing the function F1=f(a1, b1, c1, a2, b2, c2, d1). Whereas the second LE $26_2$ is capable of generating just an arbitrary four input function of F2==f2 (a2, b2, c2, d2). It should be noted that the embodiment shown in FIG. 5 is considered to non-symmetrical because the additional mux 52 is provided only in the upper LE $26_1$ and not the adjacent LE $26_2$. Thus, only the upper LE is capable of implementing a seven input LUT function. In an alternative embodiment, the additional mux 52 can be provided in the lower LE $26_2$ and not the upper LE $26_1$. The two LEs would operate in the complement of that described above.

Figure 6:
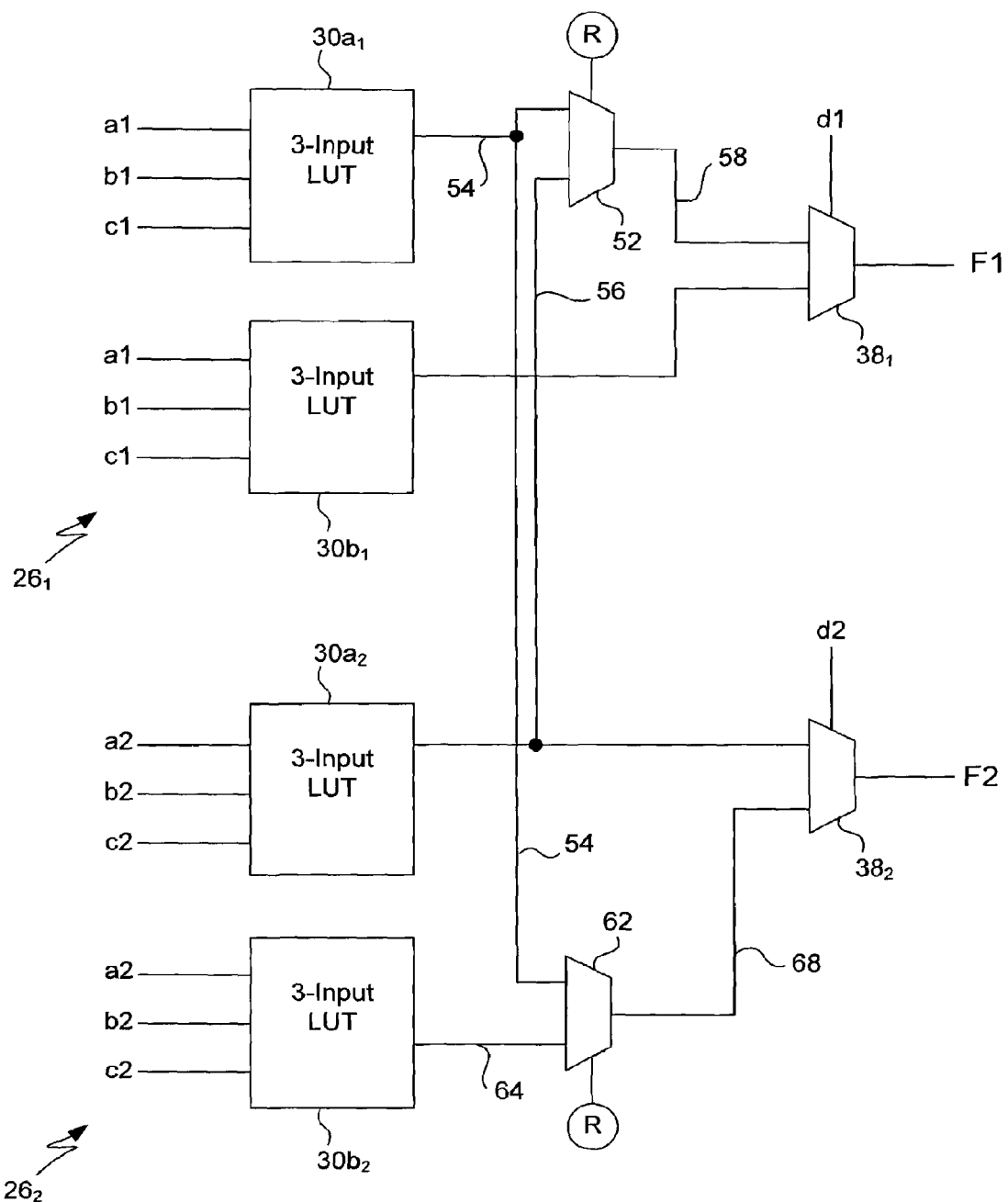
FIG. 6 is a logic diagram illustrating the combination of adjacent LUTs to implement high order logic functions according to a second embodiment of the present invention.

Referring to FIG. 6, a logic diagram illustrating a symmetrical embodiment of the present invention is shown. With this embodiment, both the upper and lower LEs $26_1$ and $26_2$ both include an additional mux. In the upper LE $26_1$, the mux 52 is provided in the identical arrangement as described with regard to FIG. 5. In the lower LE $26_2$, a mux 62 is provided between the LUT $30b_2$ and output mux $38_2$. The mux 62 is configured to receive an input 64 from the LUT $30b_2$ and output 54 from LUT $30a_1$. The output 68 of mux 62 is provided as one of the inputs to mux $38_2$. The two muxes 52 and 62 are thus symmetrical. With this arrangement, the two LEs $26_1$ and $26_2$ are each capable of performing an incomplete seven (7) input LUT function when their respective configuration bits R are set. Specifically, the LE $26_1$ is capable of implementing the function F1=f(a1, b1, c1, a2, b2, c2, d1) and the second LE $26_2$ is capable of implementing the function F2=f(a1, b1, c1, a2, b2, c2, d2). When either of the configuration bits are reset, then each of the LE $26_1$ and $26_2$ is capable of performing only an arbitrary four input function of F=f(a1, b1, c1, d1) and F=f(a2, b2, c2, d2) respectively.

Figures 7A, 7B:
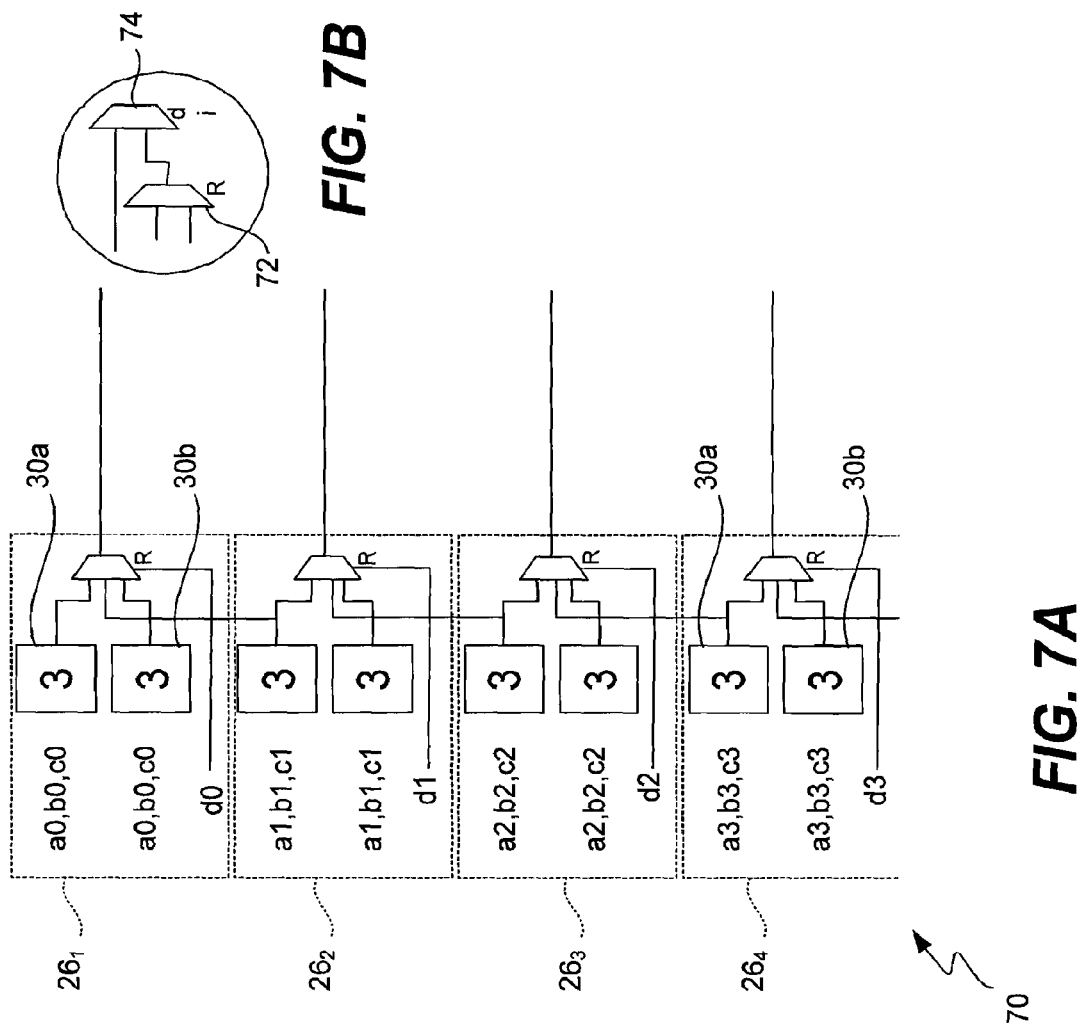
FIGS. 7A and 7B are logic diagrams illustrating the cascading of adjacent LUTs to implement high order logic functions according to a third embodiment of the present invention.

Referring to FIG. 7A, a logic diagram 70 illustrating the cascading of adjacent logic elements 26 so that each may implement an incomplete seven (7) input LUT function is shown. In the example shown, four LEs $26_1$ through $26_4$ are cascaded together such that the output of one 3 input LUT 30a of the lower LE 26 is muxed with the outputs of the two 3 input LUTs 30a and 30b of the adjacent upper LE 26. With this arrangement, each of the LEs are capable of implementing an incomplete seven (7) seven input LUT function. FIG. 7B illustrates one embodiment of the output muxing structure for each LE. The first mux 72 receives an input from the local 3 input LUT 30b and a cascaded input from the adjacent LE 26. The first mux 72 is controlled by a configuration bit R. The second mux 74, depending on the value of the d select input, determines if the LE 26 is operating in the normal mode or the incomplete seven input mode. It should be noted that in the embodiment shown, the adjacent LEs 26 are shown cascading upward. In an alternative embodiment, they can also be cascading downward. In yet another embodiment, the adjacent LEs 26 can be arranged to cascade both upward and downward at the same time.

It should be noted that the outputs of the various logic elements 26 illustrated in FIGS. 5, 6, 7A and 7B can each be applied through a register to create a registered output or can be configured to provide a combinational output, such as that illustrated in FIG. 3. However for the sake of simplicity, this feature has not been illustrated in the FIGS. 5, 6, 7A and 7B.

According to the current invention, a subset of 7-input functions can be implemented between two adjacent logic elements through use of cross-coupled inputs. Even when not using the symmetric aspects of this invention, the implementation of a single 4:1 mux per FIG. 5 results in an implementation which is faster than the otherwise next-best-case of using two 4-LUTs to construct the 6-input function. When the structure of a set of higher-order functions causes them to have several common inputs, the efficiency of the current invention is further improved. There are many opportunities for area efficiency created by the further synthesizing and placing structures into the hardware enabled by the invention, as described below.

Figure 8:
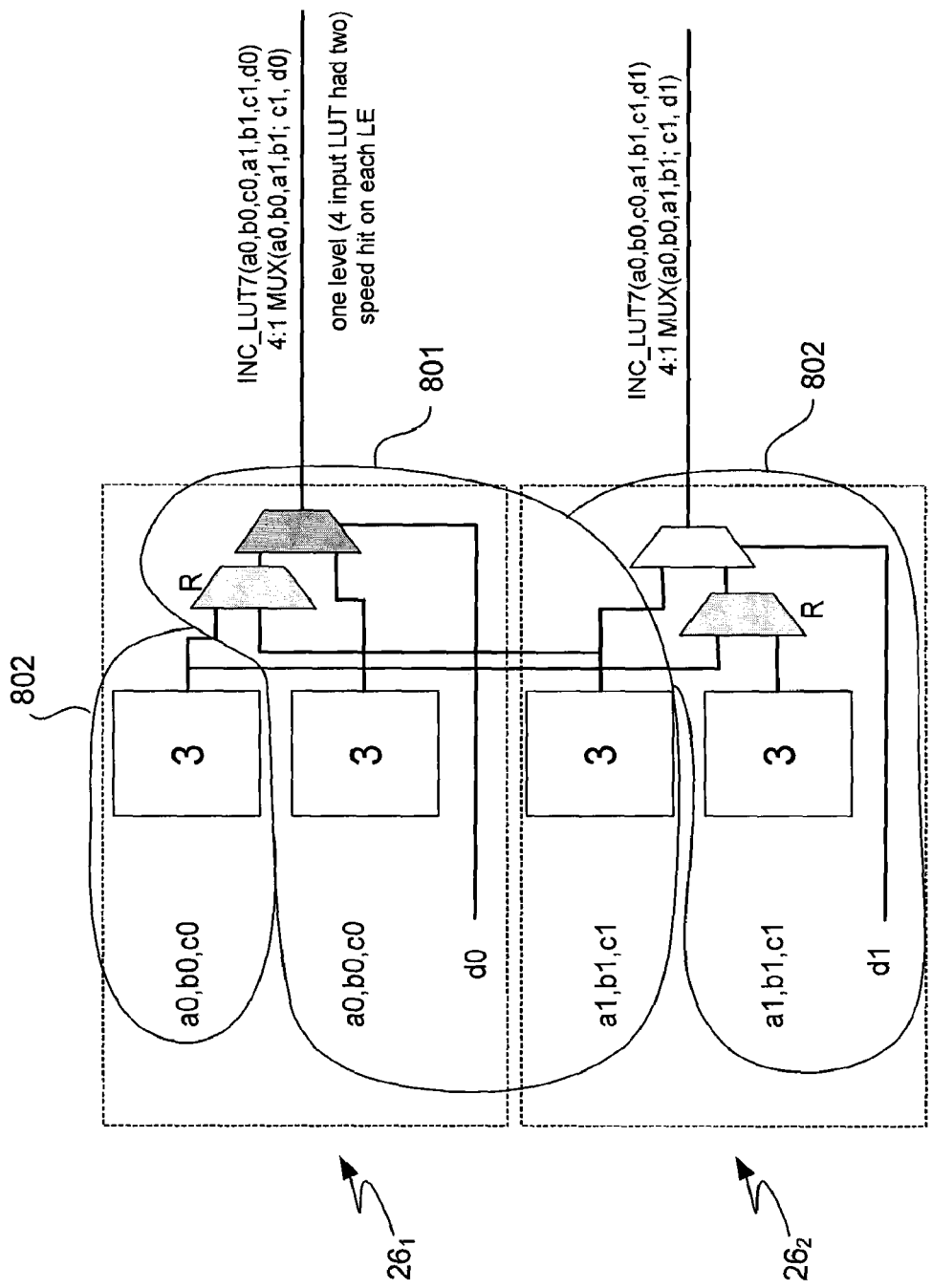
FIG. 8 is a symmetrical two mux structure according to the present invention.

FIG. 8 shows the use of the symmetric mode of FIG. 6 to create two related functions, where the region 801 makes a first 4:1 mux and the region 802 forms a second 4:1 mux. In this example, two 4:1 muxes are created by setting c0=c1 (meaning routing the same signal to both c0 and c1) and then setting LUT-masks to implement:

mux(a0,b0,a1,b1; c0,d0)
mux(a0,b0,a1,b1; c0,d1)

which are two 4:1 muxes which differ in one select bit.

Figure 9A:
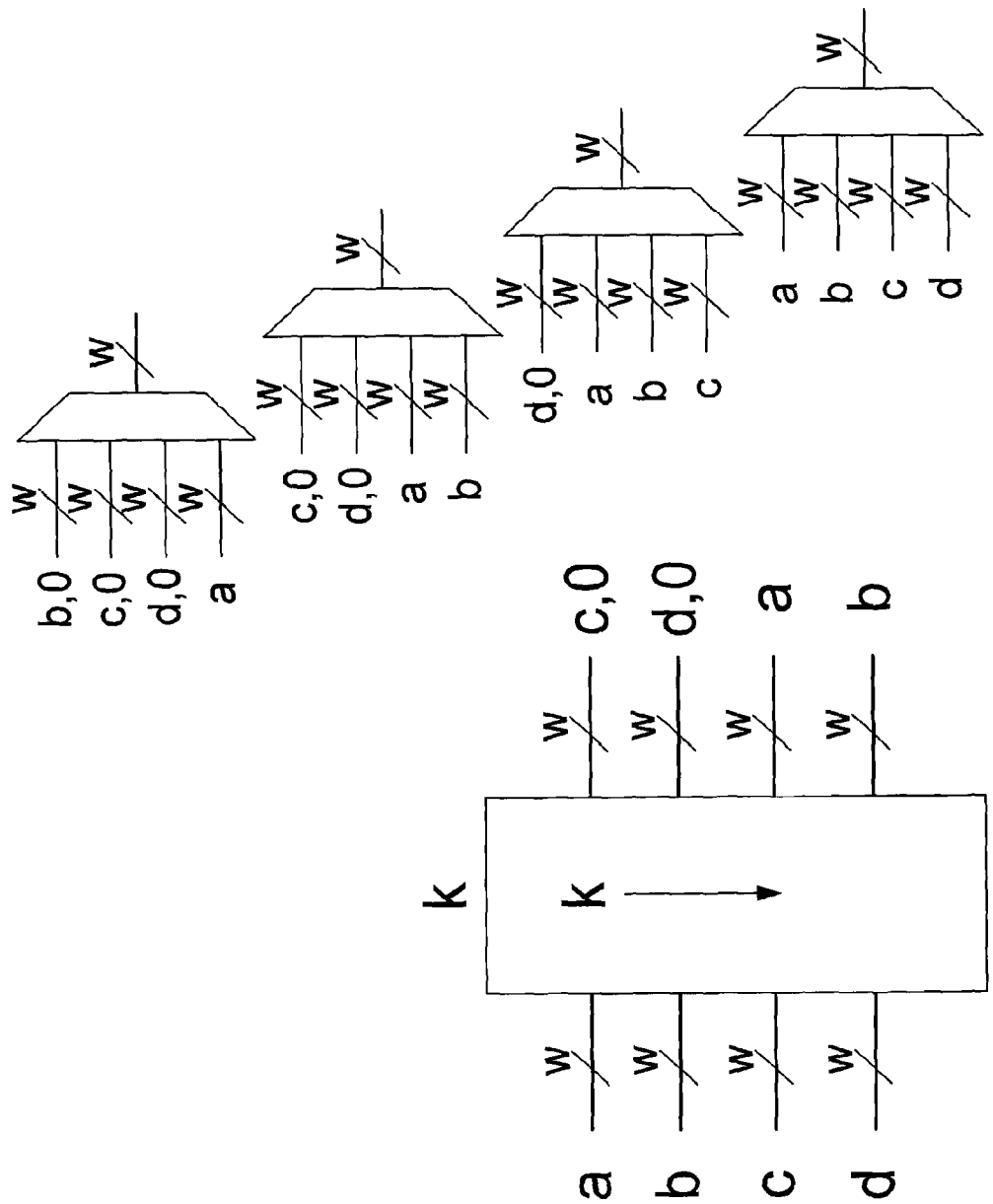

Though similar higher-order functions can occur naturally, this is particularly common in the implementation (synthesis) of so-called "mux structures" such as barrel shifters and crossbars. A barrel shifter function is shown in FIG. 9A. In this example 4 input busses of width w and a value "k" between 0 and 3 enter the block, and the result is to shift the busses down by the value k by either padding with zeros or rotating extra bits to the top. When implemented, this structure functionally creates 4*w 4:1 muxes with very similar inputs and select configurations. According to a further embodiment of this invention, software functions decompose these 4:1 muxes and place them in the hardware according to this invention to maximize the amount of sharing and the efficiency of the programmable LUT resources.

FIG. 9B shows another mux structure called a crossbar. In a crossbar, the data streams are arbitrarily rearranged, so the implementation in LUTs is literally 4*w 4:1 muxes with independent select lines. In this case, the data bits are common but the selects are always different. The saliant feature of both barrel shifters and crossbars are that the common inputs allows the current invention to be used to achieve both performance and area improvements.

The number 4 in the previous description related to FIGS. 9A and 9B is exemplary. A barrel shifter or crossbar can be constructed of an arbitrary number of data sources. Further, there are different types of barrel shifters, e.g. rotating vs. padding with zeros, bidirectional, etc), all of which generate, albeit in different ways, such similar sets of multiplexers as sub-functions of the mux structure. Additionally, permutation networks, which re-arrange data but don't allow duplication of data, are sub-classes of crossbars.

Figure 10A:
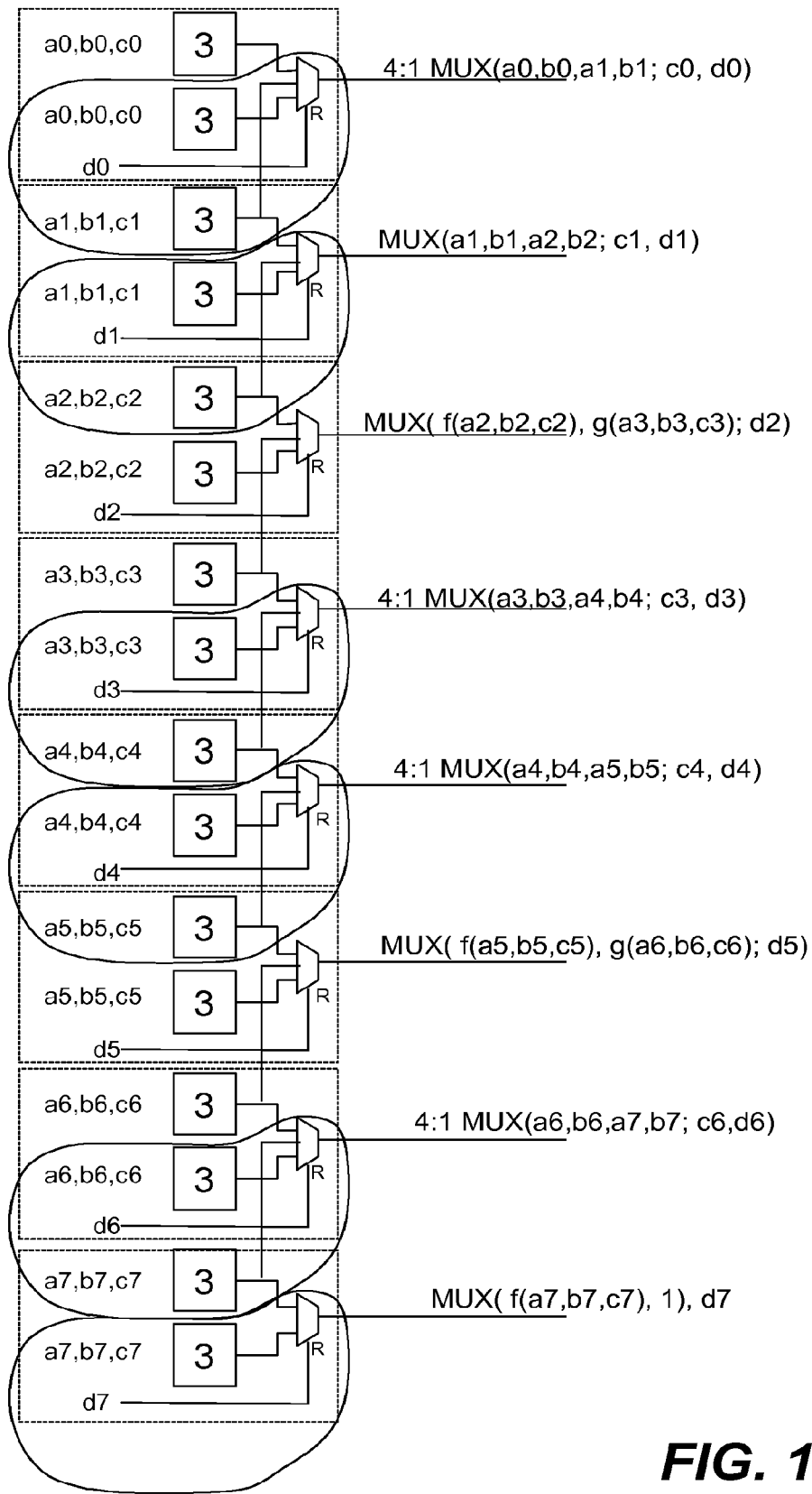
FIGS. 10A and 10B show two embodiments sharing different efficiencies of a barrel shifter and a cross-bar function according to the present invention.
Figure 10B:
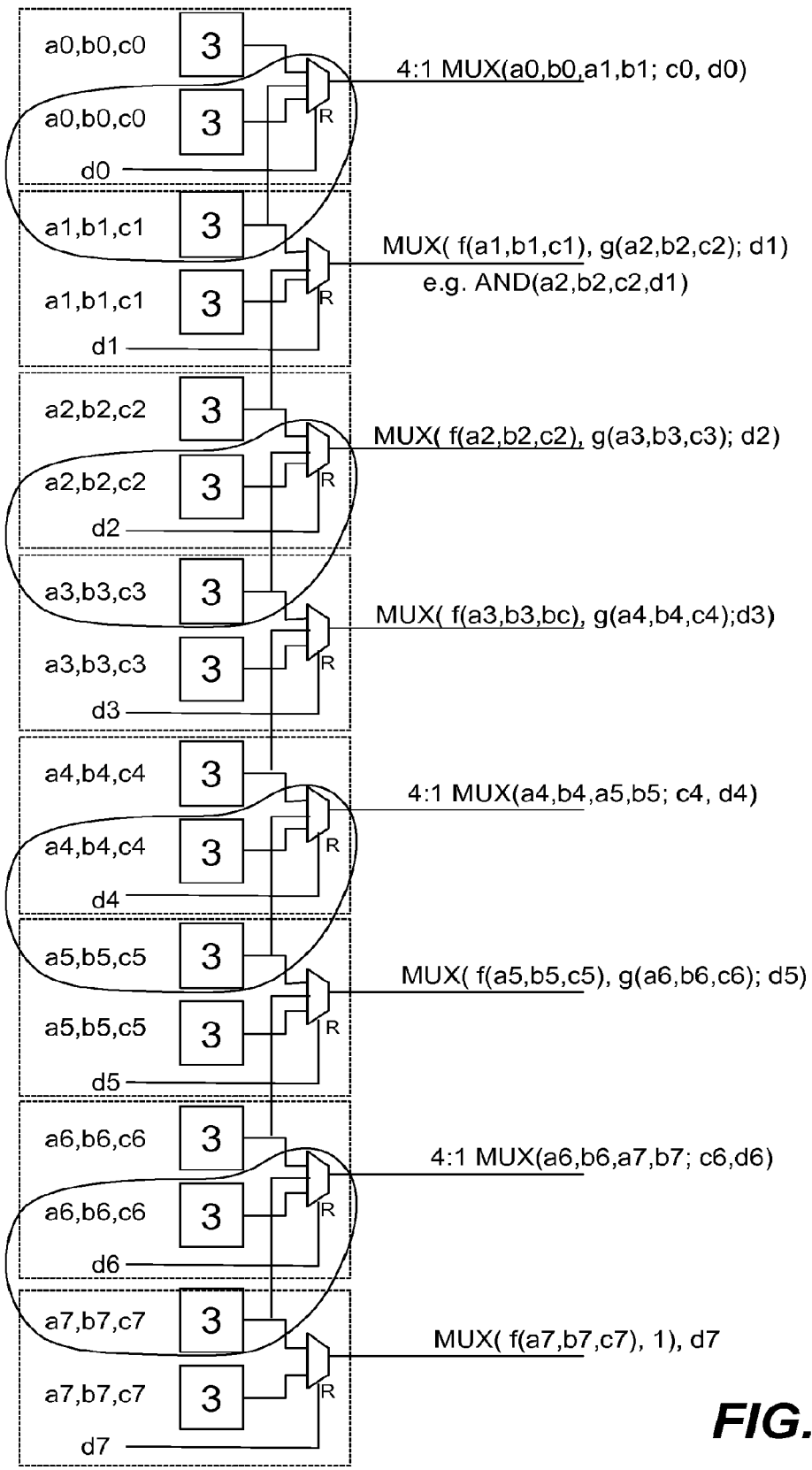

Two specific modes are enabled for making use of more higher-order functions. In the first, shown in FIG. 10A, the "paired" use of the hardware is used to create two related 4:1 muxes out of every 3 logic elements. For example, in the upper portion of the shown logic we configure 3-LUT 11.1 as mux(a0,b0; c0), 3-LUT 11.2 as mux(a1, b1, c1) and when c0=c1 by routing selection the result is two 4:1 muxes with two common and two independent data, one common and one independent select per 3 logic cells, with a remaining function with restricted inputs (the third mux from the top) possibly usable for other purposes. In the "cascaded" use of the hardware shown in FIG. 10B, every other logic cell is used to make a 4:1 mux with less restrictive input sharing (the selects need not have one common bit), and then an "orphaned" remaining function which must be matched as a template (e.g. MUX(f (a1,b1,c1), g(a2,b2,c2); d1) remains as "free" resources. E.g. the unrestricted 3-LUT f(a2,b2,c2) can be generated by routing d2=0.

To make the most use of the hardware, techniques such as bipartite matching can be applied within the software tools to best pair or pack closely related sub-functions. For more information on bipartite matching, see Cormen, Leiserson and Rivest "Introduction to Algorithms", MIT Press 1989, incorporated by reference herein for all purposes. Methods for mapping to a fracturable lookup-table structure, discussed in co-owned and pending patent application by Baeckler and Hutton in U.S. Ser. No. 10/622,923 entitled "Techniques for mapping to a shared lookup table mask", and incorporated herein for all purposes, can also be applied to map to the current function. U.S. Pat. No. 7,010,777, entitled "Shared Lookup Table Enhancements for the Efficient Implementation of Barrel Shifters", incorporated by reference herein, further describes hardware additions to fracturable lookup-tables to allow for efficient implementation of barrel shifters.

It should be noted that the term "incomplete" as used herein means that some 7-input functions can be implemented but not all the 7-input functions can be implemented. In other words, the above defined structures can define some 7-input LUT functions but not all possible 7-input LUT functions because the LUT mask is less than the total number of possible minterms (i.e., $2^7$). Among the useful functions that can be implemented fall is a subset that can be expressed as a mux receiving at its data inputs (a, b, c and d) and two select inputs (e, f).

Although the present invention was described in the context of a specific type of programmable logic device having LABs, it should be noted that the present invention can be practiced and used in any type of programmable logic device capable having logic blocks using look up tables for implementing logic functions. For example, the present invention can be used in programmable gate array (FPGA), including those having ALMs or Complex Logic Blocks as their basic logic block. For more information on Complex Logic Blocks, see the Virtex Family Overview by Xilinx Corporation, Mar. 26, 2005, incorporated by reference herein for all purposes. For more information of Logic Elements, see Altera's Stratix Architecture data sheet, Version 3.1, September, 2004, incorporated by reference herein for all purposes. It should be noted that in this application, the term "logic block" is intended to be broadly construed and cover any type of look up table based logic element, including but not limited to Logic Elements, ALMs, or Complex Logic Blocks.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An integrated circuit comprising:
   a first logic element comprising a first sub-function generator, wherein the first sub-function generator comprises a first set of selection inputs, wherein all selection inputs of the first set are operable to receive selection signals of a first plurality;
   a second logic element comprising a second sub-function generator, wherein the second sub-function generator comprises a second set of selection inputs, wherein all selection inputs of the second set are operable to receive selection signals of a second plurality other than the selection signals of the first plurality, wherein the first sub-function generator is operable to provide a first sub-function output signal based on the selection signals of the first plurality, wherein the second sub-function generator is operable to provide a second sub-function output signal based on the selection signals of the second plurality; and
   first programmable sharing circuitry coupled to the first and second logic elements, wherein the first programmable sharing circuitry is operable to use the first and second sub-function output signals to allow the first logic element to implement a function of a first order, wherein the first order is higher than a second order of a function implemented by the second logic element.

2. The integrated circuit of claim 1, wherein the selection inputs of the second set are equal in number to the selection inputs of the first set.

3. The integrated circuit of claim 1, wherein the first logic element comprises a third sub-function generator, wherein the third sub-function generator is operable to provide a third sub-function output signal.

4. The integrated circuit of claim 3, wherein the second logic element comprises a fourth sub-function generator, wherein the fourth sub-function generator is operable to provide a fourth sub-function output signal.

5. The integrated circuit of claim 4, wherein the first programmable sharing circuitry is operable to provide the first sub-function output signal to allow the first logic element to implement the function of the second order.

6. The integrated circuit of claim 4, wherein the third sub-function generator is operable to receive the selection signals of the first plurality and the fourth sub-function generator is configured to receive the selection signals of the second plurality.

7. The integrated circuit of claim 6, wherein the first programmable sharing circuitry comprises a first multiplexer operable to select the first sub-function output signal or the second sub-function output signal.

8. The integrated circuit of claim 6, further comprising a second programmable sharing circuitry coupled to the first and second logic elements, wherein the second programmable sharing circuitry is operable to receive the first sub-function output signal and the second sub-function output signal to implement the function of the first order.

9. The integrated circuit of claim 8, wherein the second programmable sharing circuitry comprises a second multiplexer.

10. The integrated circuit of claim 1, wherein the first order is incomplete.

11. The integrated circuit of claim 1, further comprising a third logic element, wherein the first and second logic elements are cascaded with the third logic element.

12. The integrated circuit of claim 11, wherein the third logic element includes a third set of selection inputs, wherein all inputs of the third set are operable to receive selection signals of a third plurality other than the selection signals of first plurality or second plurality.

13. A method comprising:
   receiving a first plurality of selection signals by all selection inputs of a first set, wherein the selection inputs of the first set belong to a first sub-function generator of a first logic element;
   receiving a second plurality of selection signals by all selection inputs of a second set, wherein the selection inputs of the second set belong to a second sub-function generator of a second logic element, wherein the selection signals of the second plurality are other than the selection signals of the first plurality of;
   providing a first sub-function output signal based on the selection signals of the first plurality;
   providing a second sub-function output signal based on the selection signals of the second plurality; and
   allowing the first logic element to implement a function of a first order higher than a second order of a function implemented by the second logic element, wherein said allowing is performed by using the first and second sub-function output signals, wherein said using the first and second sub-function output signals is performed by a first programmable sharing circuitry coupled to the first and second logic elements.

14. The method of claim 13, wherein the selection inputs of the second set are equal in number to the selection inputs of the first set.

15. The method of claim 13, further comprising:
providing by a third sub-function generator of the first logic element a third sub-function output signal; and
providing by a fourth sub-function generator of the second logic element a fourth sub-function output signal, wherein said allowing is performed by providing by the first programmable sharing circuitry the first sub-function output signal.

16. The method of claim 15, further comprising:
receiving by the third sub-function generator the selection signals of the first plurality; and
receiving by the fourth sub-function generator the selection signals of the second plurality.

17. The method of claim 16, further comprising allowing the second logic element to implement the function of the first order by using the first and second sub-function output signals, wherein said using the first and second sub-function output signals is performed by a second programmable sharing circuitry coupled to the first and second logic elements.

18. The method of claim 17, further comprising selecting to provide the first sub-function output signal or the second sub-function output signal.

19. The method of claim 13, wherein the first order is incomplete.

20. The method of claim 13, further comprising cascading a third logic element with the first and second logic elements.

21. The method of claim 20, further comprising receiving by all selection inputs within a third set of the third logic element a third plurality of selection signals, wherein the selection signals of the third plurality are other than the selection signals of the first plurality or second plurality.

22. An integrated circuit device comprising:
a plurality of input/output (I/O) elements arranged on the integrated circuit device;
a plurality of logic array blocks (LABs) coupled to the I/O elements and arranged into rows and columns across the integrated circuit device;
a random access memory (RAM) block arranged between two of the LABs to include a plurality of memory bits;
a plurality of digital signal processing (DSP) blocks coupled to the LABs and grouped into columns across the integrated circuit device to implement digital signal processing, wherein the LABs include a first logic element (LE) and a second LE, wherein the first LE includes a first sub-function generator, wherein the first sub-function generator includes a first set of selection inputs, wherein all selection inputs of the first set are operable to receive selection signals of a first plurality, wherein the second LE includes a second sub-function generator, wherein the second sub-function generator includes a second set of selection inputs, wherein all selection inputs of the second set are configured operable to receive selection signals of a first second plurality of other than the selection signals of the first plurality, wherein the first sub-function generator is operable to provide a first sub-function output signal based on the selection signals of the first plurality, wherein the second sub-function generator is operable to provide a second sub-function output signal based on the selection signals of the second plurality; and
programmable sharing circuitry coupled to the first and second logic elements, wherein the programmable sharing circuitry is operable to use the first and second sub-function output signals to allow the first logic element to implement a function of a first order higher than a second order of a function implemented by the second logic element.

23. The integrated circuit device of claim 22, wherein the selection inputs of the second set are equal in number to the selection inputs of the first set.

* * * * *